United States Patent [19]
Rodder

[11] Patent Number: 6,083,836
[45] Date of Patent: Jul. 4, 2000

[54] TRANSISTORS WITH SUBSTITUTIONALLY FORMED GATE STRUCTURES AND METHOD

[75] Inventor: Mark S. Rodder, University Park, Tex.

[73] Assignee: Texas Instruments Incorporated, Dallas, Tex.

[21] Appl. No.: 09/216,127

[22] Filed: Dec. 18, 1998

Related U.S. Application Data

[60] Provisional application No. 60/068,632, Dec. 22, 1997.

[51] Int. Cl.$^7$ .................................................. H01L 21/00
[52] U.S. Cl. .......................... 438/690; 438/691; 438/692; 438/697; 438/700; 438/712; 438/742; 438/719; 438/722
[58] Field of Search ..................................... 438/690, 691, 438/692, 697, 700, 712, 742, 719, 722

[56] References Cited

U.S. PATENT DOCUMENTS

| | | | |
|---|---|---|---|
| 4,640,000 | 2/1987 | Sato | 29/571 |
| 4,847,212 | 7/1989 | Balzan et al. | 437/41 |
| 4,965,218 | 10/1990 | Geissberger et al. | 437/41 |
| 5,429,958 | 7/1995 | Matlock | 437/34 |
| 5,966,597 | 10/1999 | Wright | 438/197 |

OTHER PUBLICATIONS

IEEE 1996 Novel High Aspect Ratio Aluminum Plug for Logic/DRAM LSIs Using Polysilicon–Aluminum Substitute (PAS), pp. 14.7.1–14.7.3 (Hiroshi Horie, Masahiko Imai, Akio Itoh and Yoshihiro Arimoto).

1984 IEEE "A New Aluminum Pattern Formation Using Substitution Reaction of Aluminum for Polysilicon and Its Application to MOS Device Fabrication", pp. 828–832 (Yukio Fukuda, Member, IEEE, Shigeto Kohda, Member, IEEE, and Yoshitaka Kitano).

Journal of Applied Physics, vol. 46, No. 11, Nov. 1975 "Interaction of Al Layers with Polycrystaline S i", pp. 4678–4684 (K. Nakamura, M–A. Nicolet, J.W. Mayer, R.J. Blattner and C.A. Evans Jr.).

J. Appl. Phys.51(3), Mar. 1980 "Grain Boundary Diffusion of Aluminum in Polycrystalline Silicon Films," pp. 1576–1581 (J.C.M. Hwang, P.S. Ho, J.E. Lewis and D.R. Campbell).

*Primary Examiner*—Benjamin L. Utech
*Assistant Examiner*—Vanessa Perez-Ramos
*Attorney, Agent, or Firm*—Jacqueline J. Garner; W. James Brady, III; Frederick J. Telecky, Jr.

[57] ABSTRACT

Transistors may be fabricated by isolating a first region (16) of a semiconductor layer from a second region (18) of the semiconductor layer (12). A first disposable gate structure (26) of the first transistor may be formed over the first region (16) of the semiconductor layer (12). The first disposable gate structure (26) may comprise a replaceable material. A second disposable gate structure (28) of the second complementary transistor may be formed over the second region (18) of the semiconductor layer (12). A replacement layer (70) may be formed over the first disposable gate structure (26). The replacement layer (70) may comprise a replacement material. At least a portion of the replaceable material of the first disposable gate structure (26) may be substitutionally replaced with the replacement material of the replacement layer (70) to form a first gate structure (80).

20 Claims, 3 Drawing Sheets

TRANSISTORS WITH SUBSTITUTIONALLY FORMED GATE STRUCTURES AND METHOD

This application claims priority under 35 USC § 119 (e) (1) of provisional application Ser. No. 60/068,632, filed Dec. 22, 1997.

TECHNICAL FIELD OF THE INVENTION

This invention relates generally to the field of semiconductor devices, and more particularly to transistors with substitutionally formed gate structures and method.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices include transistors, capacitors, resistors and the like. One type of transistor is complementary metal oxide semiconductor (CMOS) transistors. CMOS transistors are a pair of transistors of opposite type used together. CMOS transistors may be used for low-dissipation logic circuits and the like.

The gates of CMOS transistors are typically constructed of a neutral material and later doped to opposite types such as n-type and p-type. The neutral gate material is generally a material that will not adversely affect the performance of either type of gate. As a result, the gate material may not be particularly well suited for each type of gate.

The gates of CMOS transistors may be constructed using disposable gate technology in which a disposable gate dielectric and/or gate body is formed and subsequently removed. A new gate dielectric and/or gate body may then be formed in a slot from which the disposable gate dielectric and/or gate body has been removed. Reforming the gate dielectric, however, generally leads to problems in thickness when the gate dielectric is reformed by thermal means, problems with slot width enlargement when the gate dielectric is formed by deposition and/or uniformity problems for ultra-narrow slot dimensions.

SUMMARY OF THE INVENTION

Accordingly, a need has arisen in the art for improved complementary metal oxide semiconductor (CMOS) and other types of transistors. The present invention provides transistors having substitutionally formed gate structures and a method that substantially eliminates or reduces the disadvantages and problems associated with prior transistors.

In accordance with the present invention, a semiconductor device may be fabricated by isolating a first region of a semiconductor layer from a second region of the semiconductor layer. A first disposable gate structure of a first transistor may be formed over the first region of the semiconductor layer. The first disposable gate structure may comprise a replaceable material. A second disposable gate structure of a second transistor may be formed over the second region of the semiconductor layer. A replacement layer may be formed over the first disposable gate structure. The replacement layer may comprise a replacement material. At least a portion of the replaceable material of the first disposable gate structure may be substitutionally replaced with the replacement material of the replacement layer to form a first gate structure.

More specifically, in accordance with one embodiment of the present invention, the replacement and replaceable materials may be thermally annealed to substitutionally replace the replaceable material with the replacement material. In this embodiment, the replacement and replaceable materials may be thermally annealed at about 400°–500° Celsius for between about 15 to about 90 minutes. In these and other embodiments, the replacement material may be substituted in place of substantially all or all of the replaceable material.

A planarizing layer may be formed over the first and second regions and expose at least a part of the first and second disposable gate structures. In one embodiment, a cap may be formed over an exposed portion of the second disposable gate structure. In this embodiment, a replacement layer may be formed by depositing the replacement layer over the planarizing layer, an exposed portion of the first disposable gate structure and the cap. In another embodiment, the replacement layer may be formed over an exposed portion of the first and second disposable gate structures. In this embodiment, the replacement layer may be patterned and etched to re-expose the exposed portion of the second disposable gate structure.

In accordance with a particular embodiment of the present invention, the second disposable gate structure may comprise a second replaceable material. In this embodiment, a second replacement layer comprising a second replacement material may be formed over the second disposable gate structure. At least a portion of the second replaceable material of the second disposable gate structure may be substitutionally replaced with the second replacement material to form a second gate structure. The first and second replaceable materials may comprise the same material and the first and second replacement materials may comprise the same or different material.

In a particular embodiment of the present invention, a first gate body of the first gate structure may comprise a first material. A second gate body of the second gate structure may comprise a second, disparate material. In this embodiment, the first material may be the original replaceable material and comprise poly-crystalline material comprised in part of silicon, silicon-germanium or the like, and may be doped p-type. The second material may comprise aluminum or other suitable material capable of substitutionally replacing the first material.

In another particular embodiment of the present invention, a first gate body of the first gate structure may comprise a first material. A second gate body of the second gate structure may comprise a second, disparate material. In this embodiment, the first material may be the original replaceable material and may comprise poly-crystalline material comprised in part of silicon, silicon-germanium or the like, and may be doped n-type. The second material may comprise aluminum or other suitable material capable of substitutionally replacing the first material.

Important technical advantages of the present invention include providing an improved method of forming transistor gate structures. In particular, a gate body may be formed by substitutionally replacing a replaceable material of a disposable gate with a replacement material. Accordingly, gate bodies and other structures of a transistor may be formed without the pattern and/or etching steps conventionally used in disposable gate technology.

Another technical advantage of the present invention includes providing an improved transistor. In particular, a disposable gate may be replaced without replacing and/or damaging a gate dielectric. Accordingly, the transistor does not suffer from problems associated with replacing the gate dielectric such as thickness, slot width enlargement or nonuniformity for ultra-narrow slot dimensions. In addition, the resulting gate structure may have a desired work function, sheet resistance, and a low gate depletion.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1A–H of the drawings, in which like numerals refer to like parts throughout the several views. FIGS. 1A–H illustrate fabrication of complementary metal oxide semiconductor (CMOS) field effect transistors (FET) with substitutionally formed gate structures. As described in more detail below, at least part of a disposable gate structure may be substitutionally replaced to form a gate structure. Accordingly, the disposable gate structure need not be patterned and/or etched in accordance with traditional disposable gate technology. Such patterning and etching may damage and require replacement of the gate dielectric which may lead to slot width enlargement, and uniformity and thickness problems during the fabrication process. In addition, the substitutional gate technology of the present invention allows the gate structures to have desired work functions, sheet resistance, and low gate depletion.

Figure 1A:
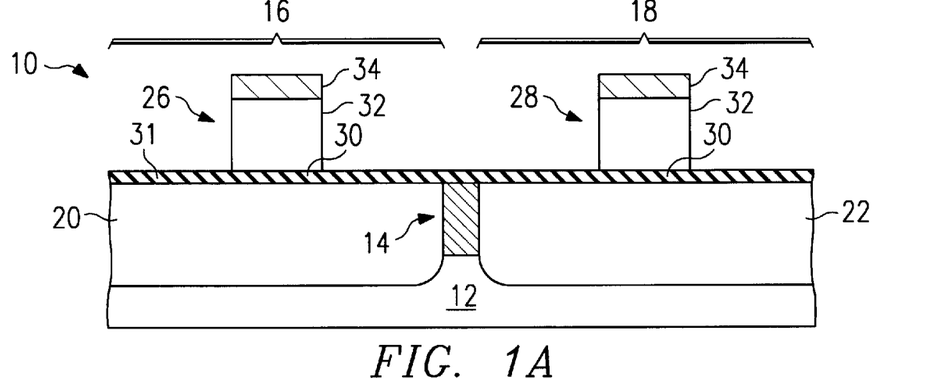
FIGS. 1A–H are a series of schematic cross-sectional diagrams illustrating fabrication of complementary transistors with substitutionally formed gate structures in accordance with one embodiment of the present invention.

FIG. 1A illustrates an initial semiconductor structure 10 for constructing the complementary transistors in accordance with one embodiment of the present invention. The complementary transistors may be of a deep sub-micron gate length, tenth-micron and below. It will be understood that the complementary transistors may be otherwise sized without departing from the scope of the present invention.

It will be further understood that non-complementary transistors may be used without departing from the scope of the present invention.

The initial semiconductor structure 10 may comprise a semiconductor layer 12. The semiconductor layer 12 may be a substrate such as a wafer. In this embodiment, the semiconductor layer 12 may comprise a single-crystalline silicon material. It will be understood that the semiconductor layer 12 may also be a layer of semiconductor material formed on a substrate. For example, the semiconductor layer 12 may be an epitaxial layer grown on a wafer, a semiconductor on insulator (SOI) system, and the like.

In one embodiment described in detail below, the first transistor may comprise a p-type transistor and the second transistor may comprise an n-type transistor. In this embodiment, the first region 16 may comprise an n-well 20 formed in the semiconductor layer 12 and the second region 18 may comprise a p-well 22 formed in the semiconductor layer 12. The n-well 20 may comprise the single-crystalline silicon material of the semiconductor layer 12 doped with an n-type dopant such as phosphorus, arsenic or antimony. The p-well 22 may comprise the single-crystalline silicon material of the semiconductor layer 12 doped with a p-type dopant such as boron. It will be understood that other types of transistors may be fabricated without departing from the scope of the present invention. For example, the transistors may both be n-type transistors or p-type transistors. It will be further understood that the semiconductor layer 12 may comprise other materials or be otherwise doped without departing from the scope of the present invention.

An isolation structure 14 may be formed in the semiconductor layer 12. The isolation structure 14 may separate the semiconductor layer 12 into a first region 16 and a second region 18. For sub-micron applications, the isolation structure 14 may comprise a shallow trench isolation structure. It will be understood that other types of isolation structures may be used without departing from the scope of the present invention.

A first disposable gate structure 26 may be formed over the first region 16 of the semiconductor layer 12. Similarly, a second disposable gate structure 28 may be formed over the second region 18 of the semiconductor layer 12. The gate structures 26 and 28 are disposable in that one or more gates may be later replaced. However, disposable gate structure 26 or 28 may remain as a gate structure.

In one embodiment, the first and second disposable gate structures 26 and 28 may be formed by the same processing steps and comprise the same materials. In this embodiment, the first and second disposable gate structures 26 and 28 may each comprise a buffer segment 30, a replaceable segment 32 and a cap segment 34. As described in more detail below, the replaceable segment 32 may allow the disposable gate structures 26 and/or 28 to be substitutionally replaced to form a gate structure. The buffer segment 30 may be disposed between the replaceable segment 32 and the semiconductor layer 12 to prevent substitution of the semiconductor layer 12 during substitutional replacement of the replaceable segment 32. The cap segment 34 may be disposed over the replaceable segment 32 to prevent growth, salicidation, or other processing of the replaceable segment 32 during subsequent processing steps that form the source and drains of the complementary transistors. As described below, if a disposable gate structure is not to be replaced, the cap segment 34 may be entitled to allow salicidation of the replaceable segment 32 which will be the gate body. This will allow the uncapped gates to be cladded during salicidation of the source and drains or at other steps in the manufacturing process. Thus, in an integrated circuit in which the gates of a first part will be substitutionally replaced and the gates of a second part will not be replaced, the gates in the second part may not be capped to allow salicidation of the gates in the second part. Such an integrated circuit may be one in which one part of the circuit utilizes nMOS and/or pMOS devices having low gate sheet resistance where threshold voltage is not as critical as obtaining low gate sheet resistance while another part of the circuit may be more easily fabricated without changing the starting gate material such as that part of the circuit dominated by gate delay which is proportional to the ratio of gate capacitance to transistor drive current, rather than by the gate resistance.

In one embodiment, the buffer segment 30 may comprise the gate dielectric of one or both of the transistors. In this embodiment, the buffer segment 30 may comprise a composite oxide nitride, a nitride, an oxide, or the like. In this and other embodiments, the buffer segments 30 may be part of a buffer layer 31 disposed over the semiconductor layer 12. The buffer layer 31 may act as an etch stop during formation of the disposable gate structures 26 and 28.

In one embodiment, the replaceable segment 32 may comprise the gate body of one of the transistors. In this embodiment, the replaceable segment 32 may comprise poly-crystalline silicon, silicon-germanium and the like in-situ or implant doped with p-type dopants such as boron where the replaceable segment 32 will form the gate body of a p-type transistor or the same materials in-situ or implant doped with n-type dopants such as arsenic or phosphorus where the replaceable segment 32 will form the gate body of an n-type transistor. In another embodiment, the replaceable segment 32 of both transistors may be replaced to form the gate bodies of the transistors. In this embodiment, the replaceable segment 32 may also comprise poly-crystalline silicon, silicon-germanium and the like. The material of the buffer segment 30 should not be substitutionally replaceable by a replacement material used in connection with the replaceable section 32 to allow the buffer segment 30 to act as a stop to replacement of the replaceable segment 32. The cap segment 34 may comprise a dielectric such as oxide. It will be understood that the buffer segment 30, replaceable segment 32 and cap segment 34 may comprise other materials without departing from the scope of the present invention. It will be further understood that the disposable gate structures 26 and 28 may comprise other materials and/or layers without departing from the scope of the present invention.

Figure 1B:
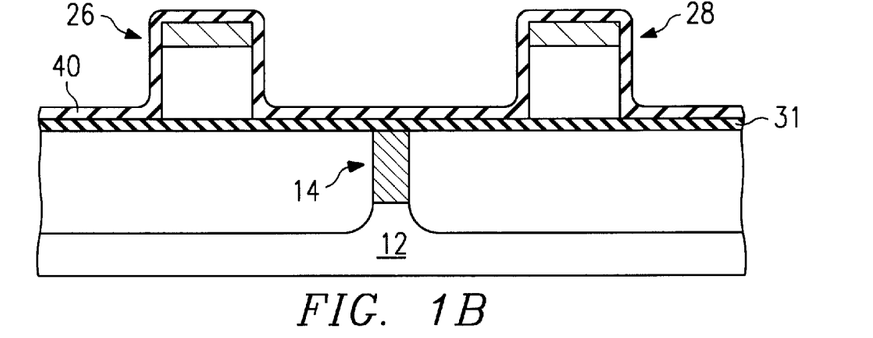

Referring to FIG. 1B, an insulating layer 40 may be formed over the first and second regions 16 and 18. A sidewall re-oxidation may be performed prior to formation of the insulating layer 40. The re-oxidation may rebuild edges of the buffer segment 30 that were etched in forming the disposable gate structures 26 and 28 and grow along edges of the replaceable segments 32.

In one embodiment, the insulating layer 40 may be deposited over the semiconductor layer 12 and the disposable gate structures 26 and 28. In this embodiment, the insulating layer 40 may be deposited on the buffer layer 31 and disposable gate structures 26 and 28. The insulating layer 40 may comprise an oxide layer, a nitride layer or the like. The insulating layer 40 may be between 50–150 angstroms thick. It will be understood that the insulating layer 40 may comprise other materials and thicknesses capable of insulating semiconductor elements without departing from the scope of the present invention.

Figure 1C:
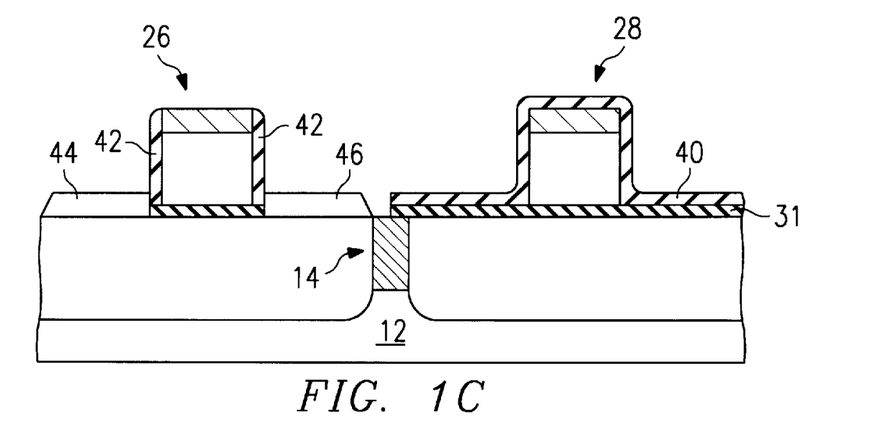

Referring to FIG. 1C, a portion of the insulating layer 40 over the first region 16 may be removed to leave a first sidewall insulator 42 about the first disposable gate structure 26. In one embodiment, this may be accomplished by masking the insulating layer 40 over the second region 18 and anisotropically etching the insulation layer 40 over the first region 16. It will be understood that the first sidewall insulator 42 may be otherwise formed without departing from the scope of the present invention. A portion of the buffer layer 31 over the first region 16 may also be removed to expose the semiconductor layer 12 in the first region 16. In one embodiment, the portion of the buffer layer 31 over the first region 16 may be removed by the anisotropic etch used to remove the portion of the insulating layer 40 over the first region 16.

A source 44 and a drain 46 may next be formed for the first transistor. In one embodiment, as shown by FIG. 1C, the source 44 and drain 46 may be raised. In this embodiment, the raised source 44 and drain 46 may comprise a doped epitaxial layer of silicon or silicon-germanium formed over the first region 16 of the semiconductor layer 12 adjacent to the disposable gate structure 26. Preferably, the raised source 44 and drain 46 are in-situ doped by appropriate means of deposition. Alternatively, the source 44 and drain 46 may be doped after deposition by means such as implant.

For the p-type transistor formed in the first region 16 of the semiconductor layer 12, the epitaxial silicon layer may be doped with a p-type dopant such as boron. Alternatively, the epitaxial silicon layer may be doped with dual dopants comprising p+ dopants over n dopants. It will be understood that the source 44 and drain 46 may comprise other dopants without departing from the scope of the present invention. It will be further understood that the source 44 and drain 46 may be otherwise formed within the scope of the present invention.

Figure 1D:
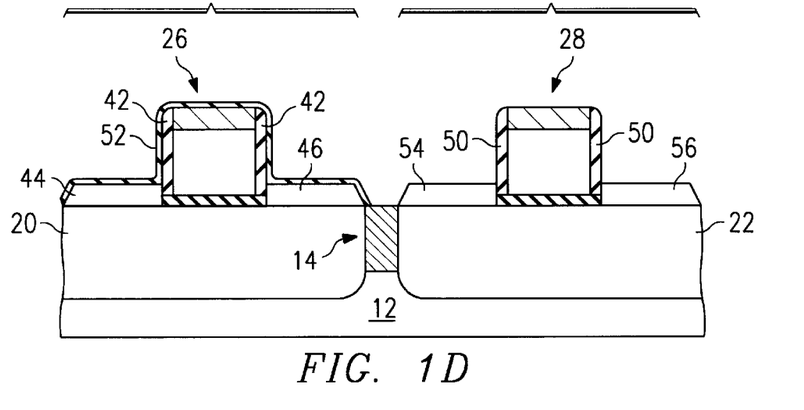

Referring to FIG. 1D, the portion of the insulating layer 40 over the second region 18 may be removed to leave a second sidewall insulator 50 about the second disposable gate structure 28. As previously described, this may be accomplished by anisotropically etching the insulation layer 40 over the second region 18. It will be understood that the second sidewall insulator 50 may be otherwise formed without departing from the scope of the present invention. A portion of the buffer layer 31 over the second region 18 may also be removed to expose the semiconductor layer 12 in the second region 18. In one embodiment, this portion may be removed by the anisotropic etch used to remove the portion of the insulating layer 40 over the second region 18.

A masking layer 52 may be deposited over the semiconductor layer 12. The masking layer 52 may protect previously formed structures such as the source 44 and drain 46 of the first transistor from further processing to form a source and a drain for the second transistor. In one embodiment, the masking layer 52 may cover the first disposable gate structure 16, first sidewall insulator 42, source 44 and drain 46 of the first transistor. In this embodiment, the masking layer 52 may be deposited over the semiconductor layer 12 and etched from the second region 18. A portion (not shown) of the masking material may remain on the second sidewall insulator 50 of the second transistor. It will be understood that the masking layer 52 may be otherwise formed without departing from the scope of the present invention. For example, the masking layer 52 may be deposited prior to removal of the insulating and buffer layers 40 and 31 in the second region 18 and an anisotropic etch to remove masking, insulating and buffer layers 52, 40 and 31 from the second region 18 at the same time.

The masking layer 52 may comprise a layer of nitride. In this embodiment, the nitride layer may be approximately 50–100 angstroms thick. It will be understood that the masking layer 52 may comprise other materials not subject to epitaxial growth without departing from the scope of the present invention.

A source 54 and a drain 56 may next be formed for the second transistor. In one embodiment, as shown by FIG. 1D, the source 54 and drain 56 may be raised. As previously described in connection with the raised source 44 and drain 46 of the first transistor, the raised source 54 and drain 56 may comprise a doped epitaxial layer of silicon or silicon-germanium formed over the second region 18 of the semiconductor layer 12 adjacent to the disposable gate 28. Preferably, the raised source 54 and drain 56 are in-situ doped by appropriate means of depositions. Alternatively, the source 54 and drain 56 may be doped after deposition by means such as implant.

For the n-type transistor formed in the second region 18 of the semiconductor layer 12, the epitaxial silicon layer may be doped with an n-type dopant such as phosphorous, arsenic or antimony. Alternatively, the epitaxial silicon layer may be doped with dual dopants comprising n+ dopants over p dopants. It will be understood that the source 54 and drain 56 of the second transistor may be otherwise formed without departing from the scope of the present invention.

The masking layer 52 may be removed at this point. In one embodiment, the masking layer 52 may be removed by a conventional anisotropic etch. A portion (not shown) of the masking material may remain on the first sidewall insulator 42 of the first transistor. It will be understood that the masking layer 52 may be otherwise removed without departing from the scope of the present invention.

After the masking layer 52 has been removed, the raised sources 44 and 54 and drains 46 and 56 may be further processed. For example, in the single or dual doped source and drain embodiment, the sources 44 and 54 and drains 46 and 56 may be subjected to rapid thermal annealing (RTA) to diffuse the dopants depending on desired gate to source and drain overlap. It will be understood that the raised sources 44 and 54 and drains 46 and 56 may be otherwise processed without departing from the scope of the present invention.

The sources 44 and 54 and drains 46 and 56 may also be cladded. The cladding forms a low resistance material over the raised source 44 and 54 and drains 46 and 56 by means of salicidation or formation of a metal layer over a portion of the raised source 44 and 54 and drains 46 and 56. Uncapped gate structures may be cladded with the sources 44 and 54 and drains 46 and 56. Cladding at this stage prior to replacement of the gate structures of the first and/or second transistors reduce heat treatments to which the replacement gate structures will be subject.

Figure 1E:
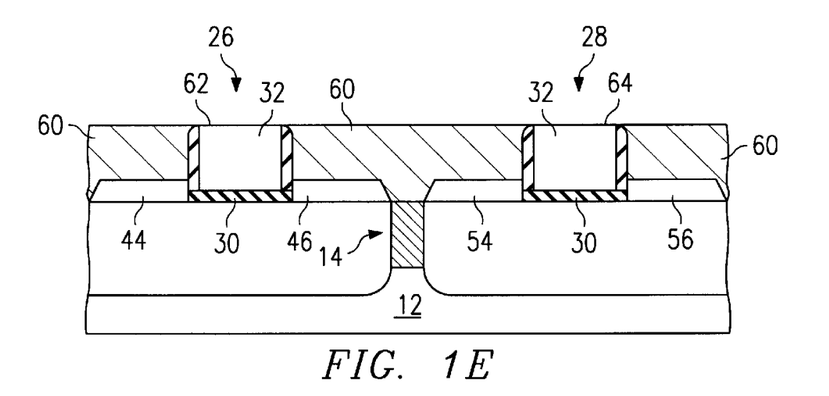

Referring to FIG. 1E, a planarizing layer 60 may be formed over the first and second regions 16 and 18 of the semiconductor layer 12. The planarizing layer 60 exposes a portion 62 of the first disposable gate structure 26 and a portion 64 of the second disposable gate structure 28. If uncapped gate structures have been previously salicided, the gate structure may not be exposed by the planarizing layer (not shown). In one embodiment, the planarizing layer 60 may be deposited directly onto the semiconductor structure and planarized to expose the replaceable segments 32 of the first and second disposable gate structures 26 and 28. In this embodiment, the planarizing layer 60 may be deposited to substantially the level of the cap segments 34 or higher and then planarized down to the level of the readily replaceable segments 32. It will be understood that the planarizing layer 60 may be otherwise formed without departing from the scope of the present invention.

In one embodiment, the planarizing layer 60 may comprise an oxide. In this embodiment, the planarizing layer 60 may be deposited by a chemical vapor deposition (CVD) process and be planarized by a chemical-mechanical polish (CMP), etch back or the like. It will be understood that the planarizing layer 60 may comprise other materials, be otherwise deposited, planarized and/or etched to expose a portion of the first and second disposable gate structures 26 and 28 without departing from the scope of the present invention. If salicided gate structures are not to be exposed by the planarizing layer, the gate structures may be protected by means as a nitride layer which is less easily removed by CMP relative to an oxide layer.

At this point in the process, with the disposable gate structures 26 and 28 exposed, a gate salicide may be formed over a gate structure if it is not to be replaced and if it has not already been salicided with the sources 44 and 54 and drains 46 and 56 as previously described. According to one embodiment, the gate of a pMOS transistor will not be replaced and the gate of an nMOS transistor will be replaced. In this embodiment, a cap (not shown) is formed over the gate of the nMOS transistor and a silicide material such as titanium is deposited over the gate of the pMOS transistor and reacted to form a metal cladding on top of the gate of the pMOS transistor, but not fully substitute for the replaceable gate structure. In another embodiment, after the gate of the nMOS transistor is covered, the gate of the pMOS transistor may be cladded with metal by a self-aligned epitaxial deposition of metal cladding material such as selective titanium silicide (TiSi$_2$) which grows only over the exposed regions of the replaceable material of the pMOS transistor. The salicidation of the gate of the pMOS transistor or of other transistors during this or other processing steps reduces the sheet resistance of the transistor.

Figure 1F:
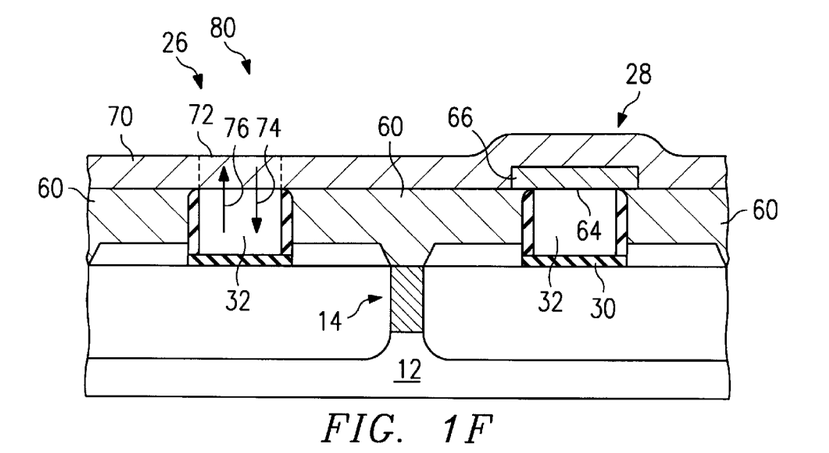

Referring to FIG. 1F, a cap 66 may be formed over the exposed portion 64 of the second disposable gate 28. In one embodiment, the cap 66 may comprise oxide, nitride or other material capable of protecting the second disposable gate 28 during substitutional replacement of the first disposable gate 26. Accordingly, as described in more detail below, the first disposable gate structure 26 may be replaced without replacing the second disposable gate structure 28 protected by the cap 66. In the nitride embodiment, the cap 66 may be 50–500 angstroms thick. It will be understood that the cap 66 may be otherwise formed and/or configured without departing from the scope of the present invention.

As described in more detail below, a replacement layer 70 may next be formed over the first disposable gate 26. The replacement layer 70 may comprise a replacement material capable of substitutionally replacing the replaceable material of the replaceable section 32 of the first disposable gate 26. Accordingly, the replaceable material will be the gate material of the first transistor. For p-type and n-type transistors, the replacement material may comprise aluminum, a composite material such as aluminum-titanium or other suitable materials capable of substitutionally replacing the replaceable material. Aluminum materials may be especially preferred for n-type transistors due to its work function, sheet resistance and low gate depletion properties. Replacement materials having other work function, sheet resistance and gate depletion properties may be preferred for p-type transistors. It will be understood that p-type and n-type transistors may comprise another replacement material capable of substituting in place of the replaceable material of the replaceable section 32 of the first disposable gate 26.

In one embodiment, the replacement layer 70 may be deposited over the planarizing layer 60, the first disposable gate 26 and the cap 66. The replacement layer 70 may be deposited to a thickness of 2,000–4,000 angstroms for a replaceable section thickness 32 of 1,500–2,500 angstroms. For the aluminum-titanium composite material, the replacement layer is a 1,500–2,000 angstroms thick layer of aluminum with an overlying 500–1,500 angstroms thick layer of titanium. It will be understood that the replacement layer 70 may be deposited to other thicknesses comprising enough replacement material to substitute for the desired portion of the removable section 32 of the first disposable gate 26 without departing from the scope of the present invention.

If the cap 66 is not used over the second disposable gate 28, the replacement layer 70 may be patterned and etched to re-expose the exposed portion 64 of the second disposable gate 26. Accordingly, the replacement material of the replacement layer 70 will not interact with the second disposable gate 28 during substitutional replacement of the removable section 32 of the first disposable gate 26. In a particular embodiment, the replacement layer 70 may be patterned and etched to leave a portion 72 substantially remaining only over the first disposable gate 26. It will be understood that the replacement layer 70 may be otherwise configured with respect to the first and second disposable gates 26 and 28 without departing from the scope of the present invention.

During the substitution process, the replacement material migrates to the gate as shown by arrow 74 and the replaceable material migrates to the overlying layer as shown by arrow 76. The replaceable material may be completely or partially displaced by the replacement material to form a first gate structure 80. Preferably, the replaceable material is completely or at least substantially displaced by the replacement material.

In one embodiment, the replacement and replaceable materials may be thermally annealed to accelerate substitutional replacement of the replaceable material with the replacement material. In a particular embodiment, the replacement and replaceable materials may be thermally annealed in the range of about 400°–500° Celsius for between about 15 to about 90 minutes. It will be understood that the replacement and replaceable materials to be otherwise thermally annealed and without departing from the scope of the present invention.

Accordingly, the first gate structure 80 may be formed without the patterning and etching steps typically associated with disposable gate technology. As a result, the gate dielectric is not damaged and need not be replaced. Thus, problems associated with regrowing or reforming the gate dielectric such as thickness, uniformity and slot width enlargement may be avoided. Additionally, the first gate structure 80 may comprise a material with a desired work function, sheet resistance and low gate depletion rate.

After substitution of the replacement material in place of replaceable material, the displaced replaceable material that has migrated to the replacement layer 70 may be removed. In one embodiment, the semiconductor structure may be planarized to remove the remaining replacement layer 70 along with the displaced replaceable material and the cap 66. In this embodiment, the semiconductor structure may be planarized by a chemical-mechanical polish (CMP) or the like. It will be understood that the remaining replacement layer 70, displaced material and cap 66 may be otherwise removed without departing from the scope of the present invention.

Figure 1G:
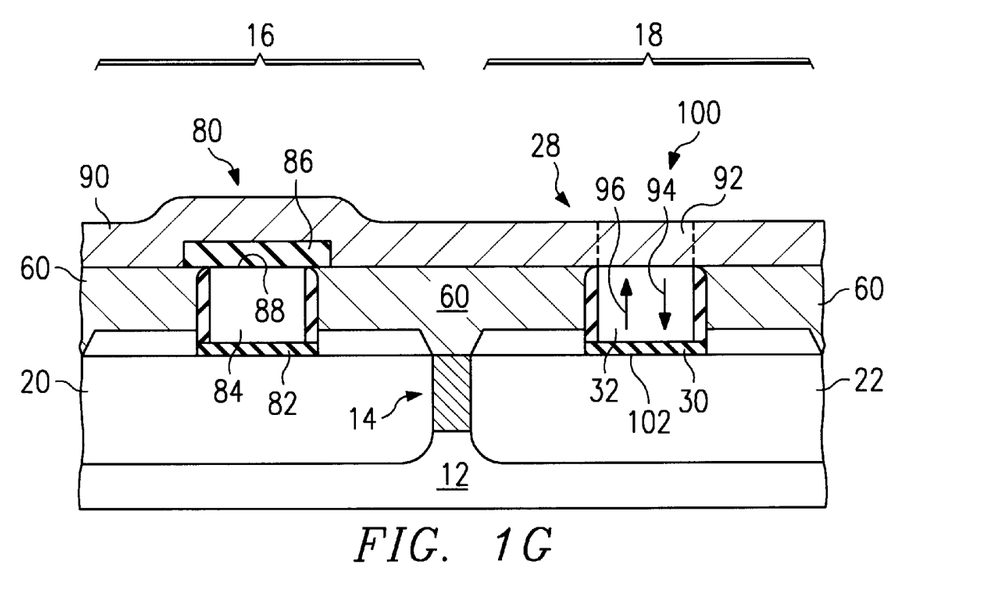

Referring to FIG. 1G, the gate structure 80 may comprise a gate dielectric 82 formed by the buffer section 30 and a gate body 84 comprising the replacement material. It will be understood that the gate structure 80 may be otherwise configured without departing from the scope of the present invention.

In one embodiment, the gate body 84 may be etched to form a T-gate and/or planarized to form a non T-gate. Methods such as selective epitaxial deposition on the non T-gate can result in formation of a T-gate due to epitaxial overgrowth. The gate body 84 may comprise a material selected to maximize operation of the p-type first transistor. In one embodiment, the gate body 74 may comprise a metallic material. It will be understood that the gate body 84 may comprise other suitable materials without departing from the scope of the present invention.

In the embodiment where the readily etchable segment 32 may comprise in part n-type gate material, the second disposable gate structure 28 may comprise the gate structure of the second gate transistor and need not be removed and replaced. In this embodiment, the second disposable gate structure 28 may include salicidation. As previously described, the salicidation is performed before replacement of the first gate structure 26 to prevent the high temperatures associated with salicidation from melting or otherwise adversely affecting the first gate structure 80. Thus, the transistors may comprise independently formed gate structures 80 and 28. The independently formed gate structures may comprise disparate materials well suited for the type of transistors in which each is used. In an embodiment where the readily etchable segment 32 may comprise in part p-type material, the first disposable gate structure 26 may be capped and the second disposable gate structure 28 removed and replaced as previously described for disposable gate structure 26. Thus, the designations of the first and second transistors as p-type and n-type transistors is for illustrative purposes and does not limit the scope of the present invention. For example, the transistors may be non-complementary transistors.

In an embodiment where the second disposable gate structure 28 is to be replaced, cap 86 may be formed over an exposed portion 88 of the first gate structure 80. In one embodiment, the exposed portion 88 of the first gate structure 80 may be the top of the gate body 84. In one embodiment, the cap 86 may comprise oxide, nitride, or other material capable of protecting the first gate structure 80 during substitutional replacement of the second disposable gate 28. Accordingly, as described in more detail below, the second disposable gate structure 28 may be replaced without replacing or otherwise adversely affecting the first gate structure 80 protected by the cap 86. In the nitride embodiment, the cap 86 may be 50–500 angstroms thick. It will be understood that the cap 86 may comprise other materials and/or be otherwise configured without departing from the scope of the present invention.

A second replacement layer 90 may be formed over the second disposable gate 28. As previously described in connection with the replacement layer 70, the second replacement layer 90 may comprise a replacement material capable of substitutionally replacing the replaceable material of the replaceable section 32 of the second disposable gate 28. Accordingly, the replaceable material will be the gate material of the second transistor. For p-type and n-type transistors, the replacement material may comprise aluminum, a composite material such as aluminum-titanium or other suitable materials capable of substitutionally replacing the replaceable material. Aluminum materials may be especially preferred for n-type transistors due to its work function, sheet resistance and low gate depletion properties. Replacement materials having other work function, sheet resistance and gate depletion properties may be performed for p-type transistors. It will be understood that p-type and n-type transistors may comprise other replacement materials capable of substituting in place of the replaceable material of the replaceable section 32 of the second disposable gate 28.

In one embodiment, the second replacement layer 90 may be deposited over the planarizing layer 60, the second disposable gate 28 and the cap 86. In that particular embodiment, the second replacement layer 90 may be deposited to a thickness of 2,000–4,000 angstroms, for a replaceable section thickness 32 of 1,500–2,500 angstroms. It will be understood that the second replacement layer 90 may be deposited to other thicknesses comprising enough replacement material to substitute for the desired portion of the removable section 32 of the second disposable gate 28 without departing from the scope of the present invention.

If the cap 86 is not used over the first gate structure 80, the second replacement layer 90 may be patterned and etched to re-expose a top 88 of the first gate structure 80. Accordingly, the replacement material of the second replacement layer 90 will not interact with the first gate structure 80 during substitutional replacement of the removable section 32 of the second disposable gate 28. In that particular embodiment, the second replacement layer 90 may be patterned and etched to leave a portion 92 substantially remaining only over the second disposable gate 28. It will be understood that the second replacement layer 90 may be otherwise configured with respect to the first gate structure 80 and the second disposable gate 28 without departing from the scope of the present invention.

As previously discussed, in connection with the first disposable gate 16, at least a portion of the replaceable material of the second disposable gate structure 28 may be substitutionally replaced with the replacement material of the second replacement layer 90. During the substitutional replacement, the replacement material of the second replacement layer 90 migrates into the replacement section 32 of the second disposable gate 18 as shown by arrow 94 and the replaceable material of the replaceable section 32 migrates to the second disposable layer 90 as shown by arrow 96. The replaceable material may be completely or partially displaced by the replacement material to form a second gate structure 100. Preferably, the replaceable material is completely or at least substantially replaced by the replacement material.

In one embodiment, the replacement and replaceable materials may be thermally annealed to accelerate the substitutional replacement. In that particular embodiment, the replacement and replaceable materials may be thermally annealed at about 400°–500° Celsius for between about 15 to about 90 minutes. It will be understood that the replacement and replaceable materials may be otherwise thermally annealed and/or substitutionally replaced without departing from the scope of the present invention.

Accordingly, the second gate structure 100 may be formed without the patterning and etching steps typically associated with disposable gate technology. As a result, the gate dielectric is not damaged and need not be replaced. Thus, problems associated with regrowing or reforming the gate dielectric such as thickness, uniformity and slot width enlargement may be avoided. Additionally, the second gate structure 100 may comprise a material with a desired work function, sheet resistance and low gate depletion rate.

Figure 1H:
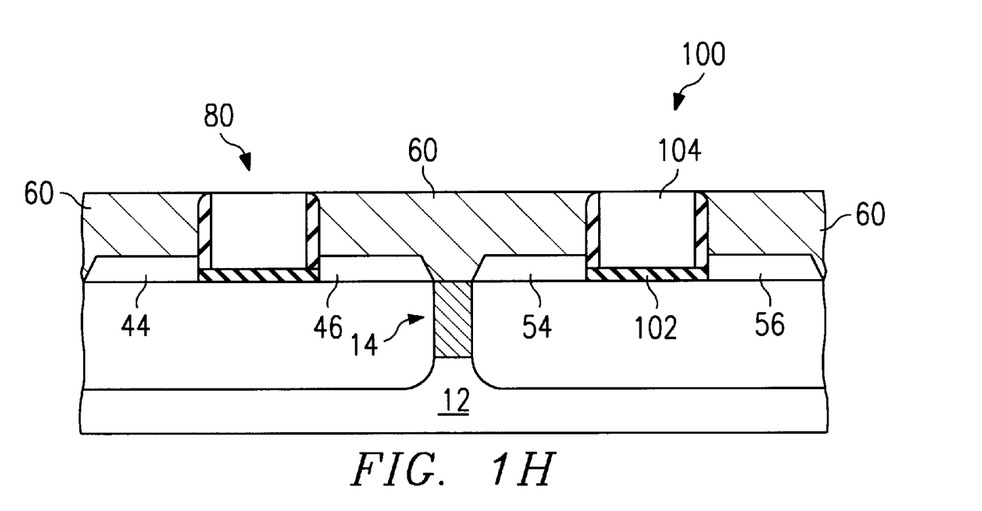

Referring to FIG. 1H, after substitution of the replacement material in place of the replaceable material, the displaced replaceable material that has migrated to the second replacement layer 90 may be removed. In one embodiment, the semiconductor structure may be planarized to remove the second remaining replacement layer 90 along with the displaced replaceable material and the cap 86. In this embodiment, the semiconductor structure 10 may be planarized by a chemical-mechanical polish (CMP) or the like. It will be understood that the remaining second replacement layer 90, displaced material and cap 86 may be otherwise removed without departing from the scope of the present invention. For embodiments in which a gate is salicided, a layer such as nitride may be formed over the salicided region. The nitride layer is not easily removed during chemical-mechanical polishing (CMP) processes. Accordingly, the chemical-mechanical polishing (CMP) steps will not damage and/or remove the salicided region. It will be understood that a salicided region may be otherwise protected during chemical-mechanical polishing (CMP) or other planarization processes.

The gate structure 100 may comprise a gate dielectric 102 formed by the buffer section 30 and a gate body 104 comprising the second replacement material. It will be understood that the gate structure 100 may be otherwise configured without departing from the scope of the present invention. In one embodiment, the first and second replaceable materials may both comprise the same material. Thus, the disposable gate body structures 16 and 18 may be replaced at the same time by a single replacement layer. In this embodiment, a protective cap need not be used nor does the replacement layer need to be patterned and etched as both disposable gate body structures 16 and 28 will be substitutionally replaced.

In one embodiment, the gate body 104 may be etched to form a T-gate and/or planarized to form a non T-gate. Methods such as selective epitaxial deposition on the non T-gate can result in formation of a T-gate due to epitaxial over growth. The gate body 104 may comprise a material selected to maximize operation of the n-type second transistor. In one embodiment, the gate body 104 may comprise aluminum and the like. It will be understood that the second gate body 104 may comprise other suitable materials without departing from the scope of the present invention.

The process of capping and substitutionally replacing all or at least part of the disposable gate structures may be repeated such that any number of transistors may have substitutionally formed gate bodies. The transistors may be complementary transistors or of the same type. Additionally, the source and drains of the transistors may be independently formed and comprise in-situ doped materials.

For the complementary transistors, the n-type and p-type gates have an associated gate work function which in part determines the threshold voltage of the transistor. The threshold voltage of transistor is determined by such factors including the gate work function, the semiconductor work function, and the dopant concentration in the transistor channel region.

As the gate dielectric thickness decreases, the dopant concentration in the transistor channel region substantially increases to result in a change of a transistor threshold voltage to a desired value. In a limit of zero dielectric thickness, the dopant concentration in the transistor channel region to change a threshold voltage to a desired value would approach the limit of an infinite dopant concentration. Thus, it is recognized that as gate dielectric thickness is reduced, the control of transistor threshold voltage by dopant density is increasingly difficult. Accordingly, it may be expected that for different applications, the threshold voltage or off current of a transistor is adjusted in part by the gate work function and not only by dopant concentration as is presently performed.

Since different gate materials or gate types have different associated gate work functions which can thus in part determine transistor threshold voltage, and due to difficulties in using dopant density to control threshold voltage, it is in part recognized that for transistors requiring different threshold voltage, the gate material or gate type can be changed for the transistors such that varying threshold voltages of transistors in a circuit can be obtained by appropriate use of varying gate materials of the transistors in a circuit. It is further recognized that while an application of different gate materials or gate types is for CMOS circuits for which there are complementary n-type and p-type transistors, and different desired threshold voltages for n-type and p-type transistors, many applications for CMOS circuits may require more than simply different threshold voltages for n-type and p-type transistors. Rather, it may additionally be required that particular n-type transistors have themselves different threshold voltages at different locations of the circuit with particular n-type transistors having a low threshold voltage and particular n-type transistors having a high threshold voltage. Similarly, it may additionally be required that particular p-type transistors have themselves different threshold voltages at different locations of the circuit with particular p-type transistors having a low threshold voltage and particular p-type transistors having a high threshold voltage. Thus, the use of varying gate material to set desired threshold voltages may be used for complementary or non-complementary transistors as desired for given circuit applications.

While the above description has discussed primarily the use of gate material or gate type with a given gate work function to set a threshold voltage, it is similarly recognized that gate material can significantly affect the gate sheet resistance. For example, the gate sheet resistance of a metal is significantly lower than that for a semiconductor material and may be lower than that for a salicide-clad gate material. It is noted that the gate sheet resistance may include a resistance contribution due to lateral current conduction along the length of the gate as well as include a resistance contribution due to vertical current conduction along the height of the gate.

The gate sheet resistance may be critical for particular circuits or for particular locations of the circuit. Furthermore, the gate sheet resistance in a circuit or particular location of a circuit may be critical for a device of one type, such as nMOS, or may be critical for other types of devices, including pMOS. It may be that for some applications, the gate sheet resistance of the device is more critical to circuit function than the threshold voltage of the device as may be true for particular RF circuits. It is also noted that the gate sheet resistance is more critical for wide devices for which the lateral current path along the length of the gate may introduce significant total gate resistance thus degrading the overall circuit performance.

Devices requiring low gate sheet resistance may utilize a new gate material by means as in a conventional disposable gate technology or by means of substitutional gate technology described herein. For example, substitution of the replaceable gate material by Al will result in a lower gate resistance than that for salicided n-type poly-Si and a threshold voltage within ~0.2 V of that for n-type poly-Si gated devices. While Al substitution may result in an ~1.0 V shift in threshold voltage when replacing the gate of a p-type poly-Si gated pMOSFET, it may be that for certain applications, this increase in pMOS Vt is not as critical as is the reduction of gate sheet resistance in changing from a p-type poly-Si gate to a metal Al gate.

In accordance with the present invention, complementary devices in a particular circuit location may have one gate material while complementary devices in a different circuit location will have another gate material. Similarly, it may be that one type of device in a particular circuit location may have one gate material while another device of the same type in a different circuit location will have another gate material. It may also be that devices in a location of the circuit for which the circuit delay is not dominated by gate resistance will be of one type of gate material, and of a particular dopant type, and devices in a location of the circuit for which the gate resistance is an important factor in circuit delay will have another gate material.

Although the present invention has been described with several embodiments, various changes and modifications may be suggested to one skilled in the art. It is intended that the present invention encompass such changes and modifications as fall within the scope of the appended claims.

What is claimed is:

1. A method of fabricating a semiconductor device, comprising the steps of:

isolating a first region of a semiconductor layer from a second region of the semiconductor layer;

forming a first disposable gate structure of a first transistor over the first region of the semiconductor layer, the first disposable gate structure comprising a replaceable material;

forming a second disposable gate structure of a second transistor over the second region of the semiconductor layer;

forming a replacement layer over the first disposable gate structure, the replacement layer comprising a replacement material; and substitutionally replacing at least a portion of the replaceable material of the first disposable gate structure with the replaceable material of the replacement layer to form a first gate structure.

2. The method of claim 1, the step of substitutionally replacing at least a portion of the replaceable material with the replacement material further comprising thermally annealing the replacement and replaceable materials.

3. The method of claim 1, the step of substitutionally replacing at least a portion of the replaceable material with the replacement material further comprising thermally annealing the replacement and replaceable materials at about 400°–500° Celsius for between about 15 to about 90 minutes.

4. The method of claim 1, wherein the portion of the replaceable material comprises substantially all of the replaceable material.

5. The method of claim 1, wherein the portion of the replaceable material comprises all of the replaceable material.

6. The method of claim 1, further comprising the steps of:

forming a planarizing layer over the first and second regions, the planarizing layer exposing at least part of the first and second disposable gate structures;

forming a cap over an exposed portion of the second disposable gate structure;

the step of forming the replacement layer further comprising depositing the replacement layer over the planarizing layer, an exposed portion of the first disposable gate structure and the cap; and the step of substitutionally replacing at least a portion of the replaceable material of the first disposable gate structure with the replacement material further comprising thermally annealing the replacement and replaceable materials.

7. The method of claim 1, further comprising the steps of:

forming a planarizing layer over the first and second regions, the planarizing layer exposing at least part of the first and second disposable gate structures;

the step of forming the replacement layer comprising forming the replacement layer over an exposed portion of the first and second disposable gate structures;

patterning and etching the replacement layer to re-expose the exposed portion of the second disposable gate structure; and the step of substitutionally replacing at least a portion of the replaceable material of the first disposable gate structure with the replacement material further comprising thermally annealing the replacement and replaceable materials.

8. The method of claim 7, the step of patterning and etching the replacement layer to re-expose the exposed portion of the second disposable gate structure further comprising patterning and etching the replacement to substantially remain only over the first disposable gate structure.

9. The method of claim 1, further comprising the step of removing the replaceable material displaced from the first disposable gate structure by the replacement material.

10. The method of claim 1, wherein the replaceable material comprises poly-crystalline silicon.

11. The method of claim 1, wherein the replacement material comprises aluminum.

12. The method of claim 1, wherein the first transistor comprises an n-type transistor and the second transistor comprises a p-type transistor.

13. The method of claim 1, wherein the first and second transistors comprise CMOS transistors.

14. The method of claim 1, wherein the second disposable gate structure comprises a second replaceable material, further comprising the steps of:

forming a second replacement layer over the second disposable gate structure, the second replacement layer comprising a second replacement material; and substitutionally replacing at least a portion of the second replaceable material of the second disposable gate structure with the second replaceable material of the second replacement layer to form a second gate structure.

15. The method of claim 14, wherein the first and second replaceable materials comprise the same material.

16. The method of claim 14, wherein the first and second replacement materials comprise the same material.

17. The method of claim 1, the step of forming the first disposable gate structure further comprising the steps of:

forming a buffer segment over the semiconductor layer operable to prevent substitution of the semiconductor layer during the substitutional replacement of a replaceable segment of the first disposable gate structure; and forming the replaceable segment of the first disposable gate structure over the buffer segment, the replaceable segment comprising the replaceable material.

18. A method of fabricating a transistor gate structure, comprising the steps of:

providing a disposable gate structure comprising a disposable gate body separated from a semiconductor layer by a gate dielectric, the disposable gate body comprising a replaceable material;

forming a replacement layer over the disposable gate body, the replacement layer comprising a replacement material; and substitutionally replacing at least a portion of the replaceable material of the disposable gate body with the replaceable material of the replacement layer to form a gate structure.

19. The method of claim 18, the step of substitutionally replacing at least a portion of the replaceable material with the replacement material further comprising thermally annealing the replacement and replaceable materials.

20. The method of claim 18, wherein the replaceable material comprises silicon and the replacement material comprises aluminum, the step of substitutionally replacing at least a portion of the replaceable material with the replacement material further comprising thermally annealing the replacement and replaceable materials.

* * * * *